United States Patent
Oh et al.

(10) Patent No.: US 9,825,003 B2
(45) Date of Patent: Nov. 21, 2017

(54) ELECTRONIC COMPONENT PACKAGE AND METHOD OF MANUFACTURING THE SAME

(71) Applicant: SAMSUNG ELECTRO-MECHANICS CO., LTD., Suwon-si, Gyeonggi-do (KR)

(72) Inventors: Kyung Seob Oh, Suwon-si (KR); Young Min Kim, Suwon-si (KR)

(73) Assignee: Samsung Electro-Mechanics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/182,376

(22) Filed: Jun. 14, 2016

(65) Prior Publication Data

US 2017/0133293 A1 May 11, 2017

(30) Foreign Application Priority Data

Nov. 6, 2015 (KR) .................. 10-2015-0155646

(51) Int. Cl.
*H01L 23/31* (2006.01)
*H01L 25/065* (2006.01)
(Continued)

(52) U.S. Cl.
CPC ...... *H01L 25/0655* (2013.01); *H01L 21/6835* (2013.01); *H01L 21/76802* (2013.01); *H01L 21/76877* (2013.01); *H01L 23/481* (2013.01); *H01L 23/544* (2013.01); *H01L 24/14* (2013.01); *H01L 21/568* (2013.01); *H01L 23/3128* (2013.01); *H01L 2221/68345* (2013.01); *H01L 2221/68372* (2013.01); *H01L 2223/54426* (2013.01); *H01L 2223/54486* (2013.01); *H01L 2224/0231* (2013.01); *H01L 2224/0237* (2013.01); *H01L 2224/05111* (2013.01); *H01L 2224/05116* (2013.01); *H01L 2224/05124* (2013.01); *H01L 2224/05139* (2013.01); *H01L 2224/05144* (2013.01);
(Continued)

(58) Field of Classification Search
CPC . H01L 2224/16055; H01L 2924/01079; H01L 2924/01029; H01L 2924/01078; H01L 2224/13099; H01L 2924/01013
See application file for complete search history.

(56) References Cited

U.S. PATENT DOCUMENTS 7,378,736 B2 * 5/2008 Morrison .......... H01L 23/49827
257/738
8,227,927 B2 7/2012 Chen et al.
(Continued)

FOREIGN PATENT DOCUMENTS

JP 2007-294610 A 11/2007
KR 10-2015-0070012 A 6/2015

*Primary Examiner* — Walter H Swanson
(74) *Attorney, Agent, or Firm* — McDermott Will & Emery LLP

(57) ABSTRACT

An electronic component package includes a first insulating layer having a via formed therein and a pattern formed thereon, an electronic component disposed on the first insulating layer so that an inactive side thereof is directed toward the first insulating layer, and a second insulating layer disposed on the first insulating layer so as to cover the electronic component and having a redistribution pattern formed thereon so as to be electrically connected to the electronic component.

14 Claims, 7 Drawing Sheets

(51) Int. Cl.
*H01L 23/48* (2006.01)
*H01L 23/544* (2006.01)
*H01L 23/00* (2006.01)
*H01L 21/768* (2006.01)
*H01L 21/683* (2006.01)
*H01L 21/56* (2006.01)

(52) U.S. Cl.
CPC .............. *H01L 2224/05147* (2013.01); *H01L 2224/05155* (2013.01); *H01L 2224/12105* (2013.01); *H01L 2224/13014* (2013.01); *H01L 2224/13016* (2013.01); *H01L 2224/13024* (2013.01); *H01L 2224/13111* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2924/0105* (2013.01); *H01L 2924/01013* (2013.01); *H01L 2924/01028* (2013.01); *H01L 2924/01029* (2013.01); *H01L 2924/01047* (2013.01); *H01L 2924/01079* (2013.01); *H01L 2924/01082* (2013.01); *H01L 2924/07025* (2013.01); *H01L 2924/10252* (2013.01); *H01L 2924/10253* (2013.01); *H01L 2924/10329* (2013.01); *H01L 2924/14* (2013.01); *H01L 2924/186* (2013.01)

(56) References Cited

U.S. PATENT DOCUMENTS

| | | |
|---|---|---|
| 8,354,304 B2 | 1/2013 | Chow et al. |
| 2009/0039496 A1* | 2/2009 | Beer ................. H01L 24/96 257/693 |
| 2010/0193930 A1* | 8/2010 | Lee ................. H01L 23/49816 257/686 |
| 2011/0127675 A1* | 6/2011 | Ewe ................. H01L 23/5389 257/773 |
| 2012/0119373 A1* | 5/2012 | Hunt ................. H01L 21/565 257/774 |
| 2013/0049182 A1* | 2/2013 | Gong ................. H01L 21/486 257/676 |
| 2015/0171002 A1 | 6/2015 | Jeon et al. |

* cited by examiner

I-I'

ELECTRONIC COMPONENT PACKAGE AND METHOD OF MANUFACTURING THE SAME

CROSS-REFERENCE TO RELATED APPLICATION

This application claims benefit of priority to Korean Patent Application No. 10-2015-0155646, filed on Nov. 6, 2015 with the Korean Intellectual Property Office, the disclosure of which is incorporated herein by reference.

TECHNICAL FIELD

The present disclosure relates to an electronic component package and a method of manufacturing the same.

BACKGROUND

An electronic component package is defined as a package technology for electrically connecting an electronic component to a printed circuit board (PCB), such as a main board of an electronic device, or the like, and protecting the electronic component from external impacts. Meanwhile, one recent main trend in the development of technology related to electronic components is to reduce a size of an electronic component. Therefore, in a package field, in accordance with a rapid increase in a demand for a small electronic component, or the like, implementation of an electronic component package having a compact size and including a plurality of connection terminals has been demanded.

One package technology suggested in order to satisfy the technical demand as described above is a wafer level package (WLP) using a redistribution wiring of an electrode pad of an electronic component formed on a wafer. An example of the wafer level package includes a fan-in wafer level package and a fan-out wafer level package. In particular, the fan-out wafer level package has a compact size and is advantageous in implementing a plurality of connection terminals. Therefore, recently, the fan-out wafer level package has been actively developed.

Recently, a cavity process has been mainly used to manufacture a fan-out type package. The cavity process may be, for example, a process of forming a cavity in a copper clad laminate (CCL), or the like, disposing the electronic component in the cavity, encapsulating the electronic component with an encapsulant, and forming a redistribution layer (RDL). Meanwhile, in the cavity process, the electronic component is disposed in the cavity, and thus, the electronic component may be relatively precisely disposed. However, in a case in which the number of cavities is increased, the cavity process may be slightly inefficient in terms of a process cost, and there is a risk that a glass fiber, or the like, within the CCL will be exposed to a wall surface of the CCL in which the cavity is formed, and thus a process defect may be caused.

SUMMARY

An aspect of the present disclosure may provide a new electronic component package in which a cavity process may be omitted, a process cost may be reduced, and an electronic component may be precisely disposed, and a method of manufacturing the same.

According to an aspect of the present disclosure, an electronic component package includes a first insulating layer having a first conductor allowing an electronic component to be precisely disposed and a second insulating layer covering the electronic component and having a second conductor capable of performing a redistribution function of the electronic component.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, the present disclosure will be described with reference to the accompanying drawings. In the accompanying drawings, shapes and dimensions of components may be exaggerated and shortened for clarity.

Electronic Device

Figure 1:
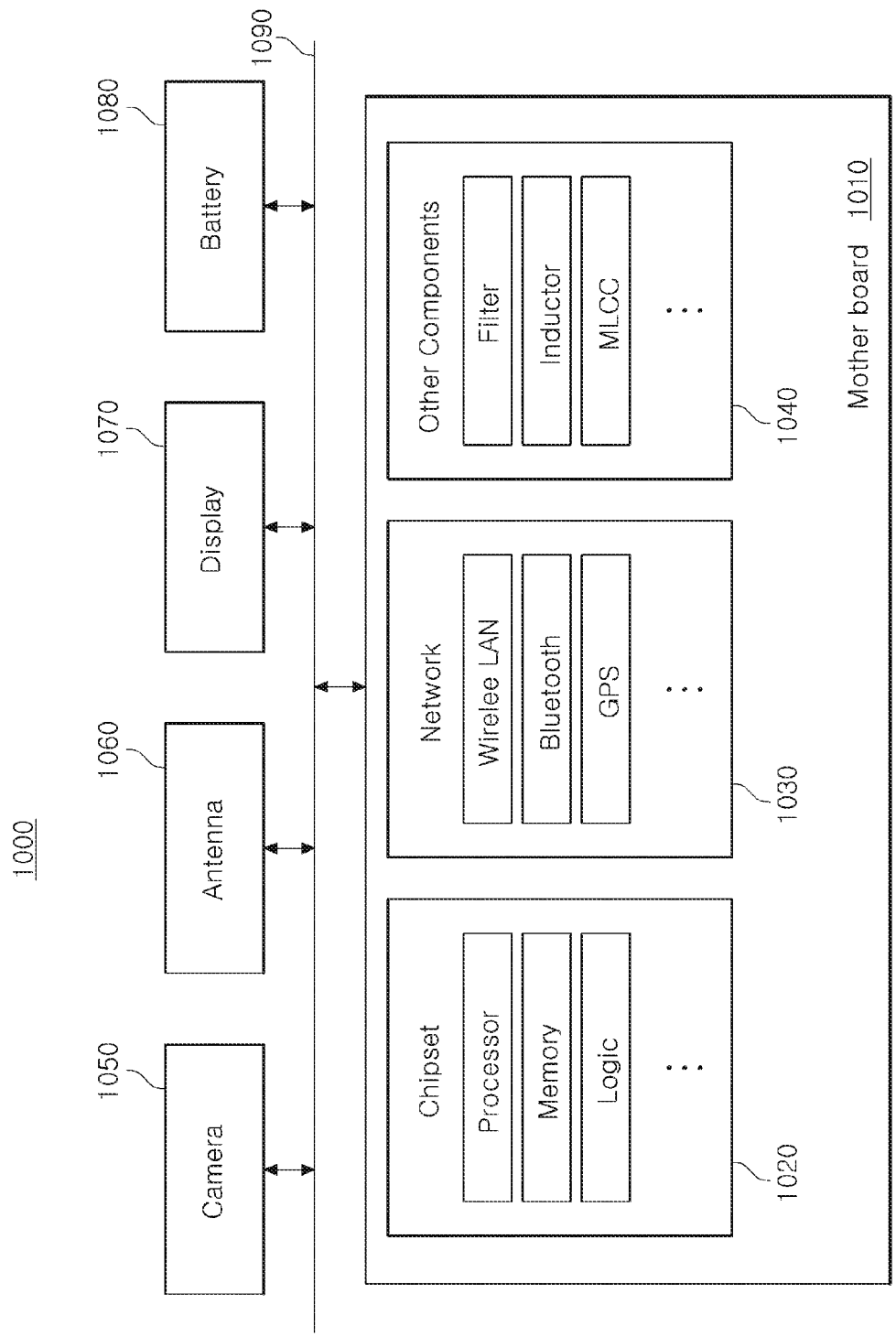
FIG. 1 is a block diagram schematically illustrating an example of an electronic device system.

FIG. 1 is a block diagram schematically illustrating an example of an electronic device system.

Referring to FIG. 1, an electronic device 1000 may accommodate a mother board 1010 therein. Chip related components 1020, network related components 1030, other components 1040, and the like, may be physically and/or electrically connected to the mother board 1010. These components may be connected to another component to be described below to form various signal lines 1090.

The chip related components 1020 may include a memory chip such as a volatile memory (for example, a dynamic random access memory (DRAM)), a non-volatile memory (for example, a read only memory (ROM)), a flash memory, etc.; an application processor chip such as a central processor (for example, a central processing unit (CPU)), a graphics processor (for example, a graphics processing unit (GPU)), a digital signal processor, a cryptographic processor, a micro processor, a micro controller, etc.; a logic chip such as an analog-to-digital converter, an application-specific integrated circuit (ASIC), etc.; and the like. However, the chip related components 1020 are not limited thereto, and may also include other types of chip related components. In addition, these components 1020 may be combined with each other.

The network related components 1030 may include protocols such as wireless fidelity (Wi-Fi) (Institute of Electrical and Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+ (HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, 5G protocols, and any other wireless and wired protocols designated after the above-mentioned protocols. However, the network related components 1030 are not limited thereto, and may also include any of a plurality of other wireless or wired standards or protocols. In addition, these components 1030 may be combined with each other together with the chip related components 1020 described above.

Other components 1040 may include a high frequency inductor, a ferrite inductor, a power inductor, ferrite beads, a low temperature co-firing ceramic (LTCC), an electromagnetic interference (EMI) filter, a multilayer ceramic capacitor (MLCC), and the like. However, the other components 1040 are not limited thereto, and may also include passive components used for various other purposes, and the like. In addition, these other components 1040 may be combined with each other together with the chip related components 1020 and/or the network related components 1030 described above.

The electronic device 1000 may include other components that are or are not physically and/or electrically connected to the mother board 1010 depending on a kind thereof. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), amass storage (for example, a hard disk drive) (not illustrated), a compact disk (CD) (not illustrated), a digital versatile disk (DVD) (not illustrated), and the like. However, these other components are not limited thereto, and may also include other components used for various purposes depending on a kind of electronic device 1000.

The electronic device 1000 may be a smartphone, a personal digital assistant, a digital video camera, a digital still camera, a network system, a computer, a monitor, a tablet, a laptop, a netbook, a television, a video game console, a smart watch, or the like. However, the electronic device 1000 is not limited thereto, and may also be any other electronic device processing data.

Figure 2:
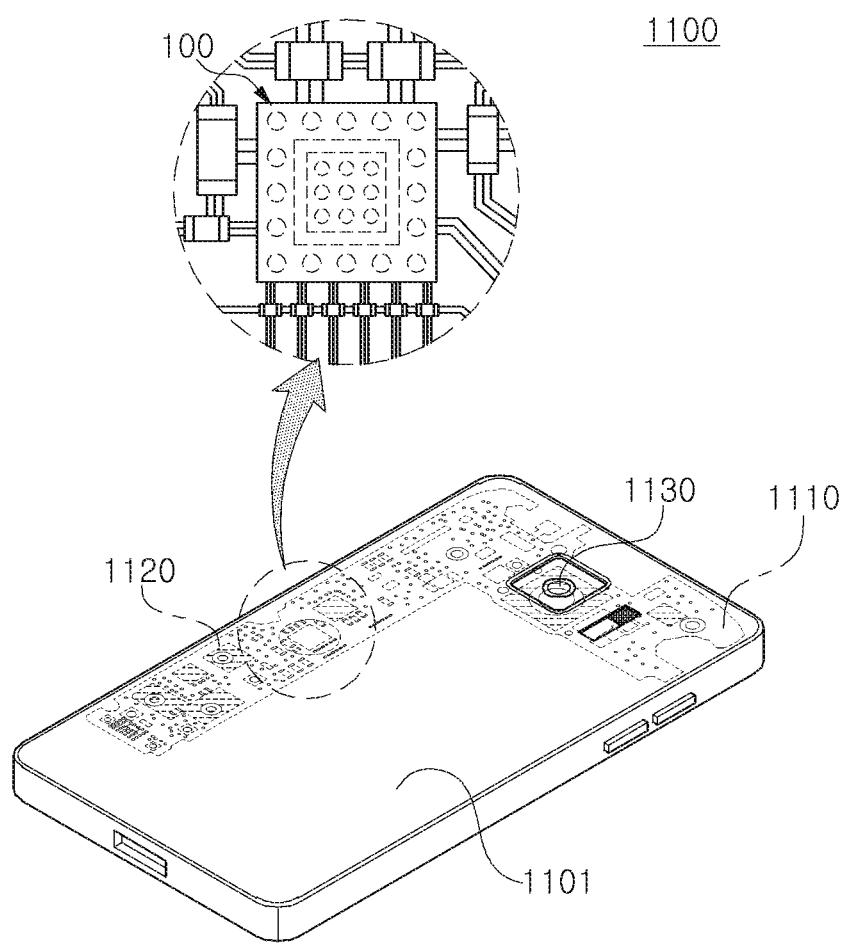
FIG. 2 is a view schematically illustrating an example of an electronic component package used in an electronic device.

FIG. 2 is a view schematically illustrating an example of an electronic component package used in an electronic device.

The electronic component package may be used for various purposes in the various electronic devices 1000 as described above. For example, a main board 1110 may be accommodated in a body 1101 of a smartphone 1100, and various electronic components 1120 may be physically and/or electrically connected to the main board 1110. In addition, another component that may be or may not be physically and/or electrically connected to the main board 1110, such as a camera 1130, may be accommodated in the body 1101. Here, some of the electronic components 1120 may be the chip related components as described above, and the electronic component package 100 may be, for example, an application processor among the chip related components, but is not limited thereto.

Electronic Component Package

Figure 3A:
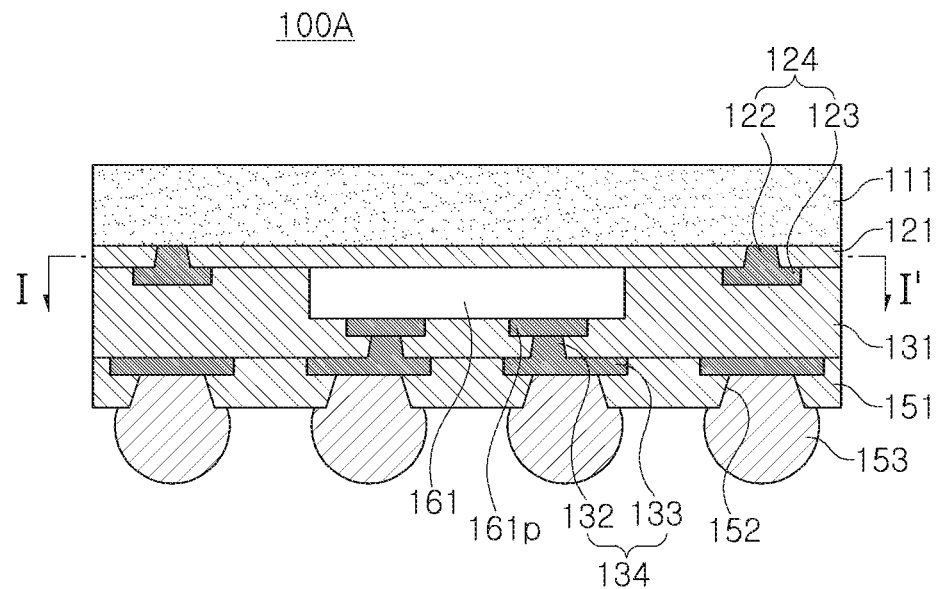
FIGS. 3A and 3B are cross-sectional views schematically illustrating an example of an electronic component package.
Figure 3B:
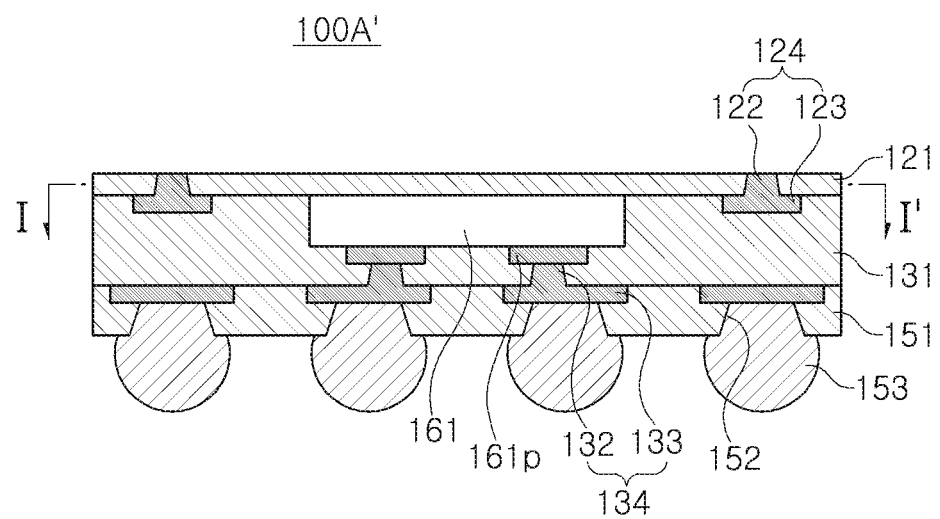

FIGS. 3A and 3B are cross-sectional views schematically illustrating an example of an electronic component package.

Figure 4:
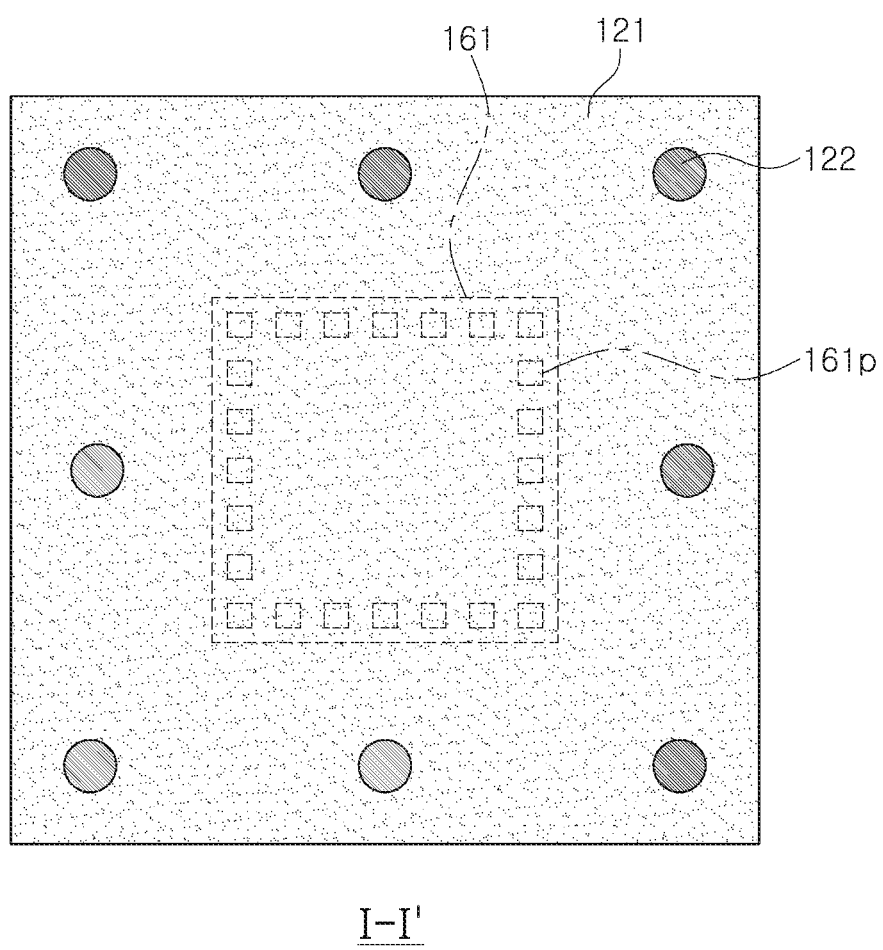
FIG. 4 is a schematic plan view of the electronic component package taken along line I-I' of FIGS. 3A and 3B.

FIG. 4 is a schematic plan view of the electronic component package taken along line I-I' of FIGS. 3A and 3B.

Referring to FIGS. 3A through 4, an electronic component package 100A/100A' according to an example may include a first insulating layer 121 having first conductors 124 formed thereon, an electronic component 161 disposed on the first insulating layer 121 so that an inactive side thereof is directed toward the first insulating layer 121, and a second insulating layer 131 disposed on the first insulating layer 121 to cover the electronic component 161 and having second conductors 134 formed thereon. Here, the first conductors 124 may be disposed to be spaced apart from the electronic component 161 by a predetermined distance, and may serve as fiducial marks for disposing the electronic component 161. In addition, the second conductors 134 may be electrically connected to the electronic component 161, and may serve as a redistribution wiring of the electronic component 161.

As described above, generally, the cavity process has been mainly used to manufacture a fan-out type package. The cavity process may be, for example, a process of forming a cavity in a copper clad laminate (CCL), or the like, disposing the electronic component in the cavity, encapsulating the electronic component with an encapsulant, and forming a redistribution layer. Meanwhile, in the cavity process, the electronic component is disposed in the cavity, and thus, the electronic component may be relatively precisely disposed. However, in a case in which the number of cavities to be formed is increased, the cavity process may be slightly inefficient in terms of a process cost, and a there is a risk that a glass fiber, or the like, within the CCL will be exposed through a wall surface of the CCL in which the cavity is formed, and thus a process defect may be caused. Since an additional process is required in order to remove the exposed glass fiber, or the like, the cavity process may be slightly inefficient in terms of the process cost.

On the other hand, in a case of the electronic component package 100A/100A' according to an example, the first insulating layer 121 having the first conductors 124 allowing the electronic component 161 to be precisely disposed may be introduced, the electronic component 161 may be disposed on the first insulating layer 121, and the electronic component 161 may be covered with the second insulating layer 131 having the second conductors 134 capable of performing a redistribution function of the electronic component 161. Therefore, the cavity process may be omitted, the process cost may be reduced, and the electronic component may be precisely disposed.

Hereinafter, respective components of the electronic component package 100A/100A' according to an example will be described in more detail.

The electronic component 161 may be various active components (such as a diode, a vacuum tube, a transistor, and the like) or passive components (such as an inductor, a condenser, a resistor, and the like). Alternatively, the electronic component 161 may be an integrated circuit (IC) indicating a chip in which hundreds to millions or more of elements are integrated. The integrated circuit may be an application processor chip such as a central processor (for example, a CPU), a graphics processor (for example, a GPU), a digital signal processor, a cryptographic processor, a micro processor, a micro controller, or the like, but is not limited thereto.

The electronic component 161 may have electrode pads 161P. A layer on which the electrode pads 161P are formed is called an active side, and an opposite layer to the layer on which the electrode pads 161P are formed is called an inactive side. The purpose of the electronic pad 161P may be to electrically connect the electronic component 161 to another component, and a material of the electrode pad 161P is not particularly limited as long as it is a conductive material. The conductive material may be copper (Cu), aluminum (Al), silver (Ag), tin (Sn), gold (Au), nickel (Ni), lead (Pd), or alloys thereof, but is not limited thereto. The electrode pads 161P may be redistributed by the second conductors 134 formed on the second insulating layer 131. The electronic pad 161P may have a protrusion form, as illustrated in FIGS. 3A through 4, but is not limited thereto. That is, the electrode pad 161 may be at least partially embedded in a body of the electronic component 161.

In a case in which the electronic component 161 is the integrated circuit, the electronic component 161 may have a body (not denoted by a reference number), a passivation layer (not denoted by a reference number), and the electrode pads 161P. The body may be formed on the basis of, for example, an active wafer. In this case, silicon (Si), germanium (Ge), gallium arsenide (GaAs), or the like, may be used as a basic material of the body. The passivation layer may serve to protect the body from external factors, and may be formed of, for example, an oxide layer, a nitride layer, or the like, or may be formed of a double layer of an oxide layer and a nitride layer. A conductive material such as copper (Cu), aluminum (Al), silver (Ag), tin (Sn), gold (Au), nickel (Ni), lead (Pd), or alloys thereof, may be used as a material of the electrode pad 161P.

The first insulating layer 121 may protect a rear side of the electronic component 161, and may have the first conductors 124 so that the electronic component 161 may be precisely disposed. An insulating material may be used as materials of the first insulating layer 121. Here, the insulating material may be a thermosetting resin such as an epoxy resin, a thermoplastic resin such as a polyimide resin, a resin having a reinforcement material such as a glass fiber or an inorganic filler impregnated in the thermosetting resin and the thermoplastic resin, such as pre-preg, Ajinomoto Build up Film (ABF), FR-4, Bismaleimide Triazine (BT), or the like. A photo imagable dielectric material such as a photo-imagable dielectric (PID) resin may be used as a material of the first insulating layer 121. In this case, the first insulating layer 121 may be formed at a more reduced thickness, and fine pitches of the first conductors 124 formed on the first insulating layer 121 may be more easily implemented. A material having an elastic modulus lower than that of a general insulating resin may be used as a material of the first insulating layer 121. In this case, stress generated in the electronic component may be alleviated, and thus a warpage phenomenon may be reduced.

The first conductors 124 may be references for precisely disposing the electronic component 161. That is, the first conductors 124 may be the fiducial marks. However, the first conductors 124 are not necessarily limited. That is, some of the first conductors may be another kind of pattern that may perform another function depending on a disposition form of the first conductors 124, or the like, if necessary. The first conductors 124 may include first vias 122 penetrating through at least portions of the first insulating layer 121 and first patterns 123 disposed on the first insulating layer 121 and connected to the first vias 122, respectively. The first vias 122 and the first patterns 123 may be simultaneously formed. Therefore, the first vias 122 and the first patterns 123 may be integrated with each other so that boundaries therebetween are not distinguished. Materials of the first via 122 and the first pattern 123 may be a conductive material such as copper (Cu), aluminum (Al), silver (Ag), tin (Sn), gold (Au), nickel (Ni), lead (Pd), or alloys thereof, but are not limited thereto. In some cases, the first conductors 124 may include only the first vias 122, and may serve as the fiducial marks by only the first vias 122.

The first vias 122 may be a kind of dummy vias in terms of electrical connection. That is, the first vias 122 may be electrically insulated from the electronic component 161. However, in a case in which functions other than the fiducial marks are given, some of the first vias 122 may also be electrically connected to the electronic component 161. The first via 122 may be completely filled with a conductive material. Alternatively, a conductive material may be formed along a wall of the via. In addition, the first via 122 may have all of the shapes known in the related art, such as a tapered shape in which a diameter of the via becomes smaller toward a lower surface, a reverse tapered shape in which a diameter of the via becomes larger toward a lower surface, a cylindrical shape, and the like. The first patterns 123 may also be a kind of dummy patterns in terms of electrical connection. That is, the first patterns 123 may also be electrically insulated from the electronic component 161. However, in a case in which functions other than the fiducial marks are given, some of the first patterns 123 may also be electrically connected to the electronic component 161.

The second insulating layer 131 may cover the electronic component 161 to generally protect the electronic component 161, and may have the second conductors 134 so that the electronic component 161 may be redistributed. An insulating material may be used as materials of the second insulating layer 131. Here, the insulating material may be a thermosetting resin such as an epoxy resin, a thermoplastic resin such as a polyimide resin, a resin having a reinforcement material such as a glass fiber or an inorganic filler impregnated in the thermosetting resin and the thermoplastic resin, such as pre-preg, ABF, FR-4, BT, or the like. A photo imagable dielectric material such as a photo-imagable dielectric (PID) resin may also be used as a material of the second insulating layer 131. In this case, the second insulating layer 131 may be formed at a more reduced thickness, and fine pitches of the second conductors 134 formed on the second insulating layer 131 may be more easily implemented. A material having an elastic modulus lower than that of a general insulating resin may be used as a material of the second insulating layer 131. In this case, stress generated in the electronic component may be alleviated, and thus a warpage phenomenon may be reduced. The second insulating layer 131 may contain a material that is the same as or different from that of the first insulating layer 121. In some cases, a boundary between the first insulating layer 121 and the second insulating layer 131 may or may not be distinguished. In a case in which the second insulating layer 131 contains the material that is the same as that of the first insulating layer 121, close adhesion between the first insulating layer 121 and the second insulating layer 131 may be improved.

The second conductors 134 may serve to redistribute the electronic component 161, more specifically, the electronic pads 161P of the electronic component 161. That is, the second conductors 134 may be a redistribution pattern. However, the second conductors 134 are not limited thereto, and may perform other functions depending on a disposition form, or the like, thereof, if necessary. The second conductors 134 may include second vias 132 penetrating through at least portions of the second insulating layer 131 and second patterns 133 disposed on the second insulating layer 131 and connected to the second vias 132, respectively. The second vias 132 and the second patterns 133 may be simultaneously formed. Therefore, the second vias 132 and the second patterns 133 may be integrated with each other so that boundaries therebetween are not distinguished. Materials of the second vias 132 and the second patterns 133 may be a conductive material such as copper (Cu), aluminum (Al), silver (Ag), tin (Sn), gold (Au), nickel (Ni), lead (Pd), or alloys thereof, but are not limited thereto.

The second via 132 may electrically connect the second pattern 133, the electrode pads 120P, and the like, formed on different layers to each other, thereby forming an electrical path within the electronic component package 100A/100A'. The second via 132 may be completely filled with a conductive material. Alternatively, a conductive material may be formed along a wall of the via. In addition, the second via 132 may have all of the shapes known in the related art, such as a tapered shape in which a diameter of the via becomes smaller toward a lower surface, a reverse tapered shape in which a diameter of the via becomes larger toward a lower surface, a cylindrical shape, and the like. Due to sequential manufacturing steps to be described with reference to FIG. 5, in a same thickness direction of the electronic component package 100A/100A', the diameter of the first via 122 and the diameter of the second via 132 may both become smaller or both become larger. For example, the diameter of the first via 122 and the diameter of the second via 132 may both become larger in the thickness direction along which the first insulating layer 121, the electronic component 161, and the third insulating layer 151 are stacked in an order of the first insulating layer 121, the electronic component 161, and the third insulating layer 151. The second wiring layer 133 may perform various functions depending on a design of the corresponding layer. For example, the second pattern 133 may serve as a ground (GND) pattern, a power (PWR) pattern, a signal (S) pattern, and the like. Here, the signal (S) pattern may include various signals except for the ground (GND) pattern, the power (PWR) pattern, and the like, such as data signals, and the like. In addition, the second pattern 133 may serve as a via pad, a connection terminal pad, or the like.

The electronic component package 100A/100A' according to an example may further include a third insulating layer 151 disposed on the second insulating layer 131 and having opening parts 152 formed therein; and connection terminals 153 disposed in the opening parts 152 of the third insulating layer 151. The third insulating layer 151 may protect the second pattern 133, or the like, from external physical and chemical damage, or the like. The opening parts 152 of the third insulating layer 151 may expose at least portions of the second pattern 133. The purpose of the connection terminals 153 may be to physically and/or electrically externally connect the electronic component package 100A/100A'. For example, the electronic component package 100A/100A' may be mounted on the main board of the electronic device through the connection terminals 153. The connection terminals 153 may be disposed in the opening parts 152, and may be connected to the conductive patterns 133 exposed through the opening parts 152. Therefore, the connection terminals 153 may also be electrically connected to the electronic component 161. In addition to the connection terminals 153, other surface-mounting technology (SMT) components may be disposed on the third insulating layer 151. In this case, the third insulating layer 151 may be surface-treated by a known method in order to improve adhesion.

A material of the third insulating layer 151 is not particularly limited. For example, a solder resist may be used as a material of the third insulating layer 151. In addition, the third insulating layer 151 may be formed of a known insulating resin, or the like, similar to the first insulating layer 121 and/or the second insulating layer 131. For example, the same materials as that of the first insulating layer 121 and/or the second insulating layer 131, such as the same photo-imagable dielectric resin may be used as a material of the third insulating layer 151. In some cases, a boundary between the third insulating layer 151 and the second insulating layer 131 may or may not be distinguished. The third insulating layer 151 is generally a single layer, but may also be formed of multiple layers, if necessary.

The connection terminal 165 may be formed of a conductive material, such as copper (Cu), aluminum (Al), silver (Ag), tin (Sn), gold (Au), nickel (Ni), lead (Pd), solder, or the like, but is not particularly limited thereto. The connection terminal 165 may be a land, a ball, a pin, or the like. The connection terminal 153 may be formed of multiple layers or a single layer. In a case in which the connection terminal 153 is formed of multiple layers, the connection terminal 153 may contain a copper pillar and a solder, and in a case in which the connection terminal 153 is formed of a single layer, the connection terminal 153 may contain a tin-silver solder or copper. However, this is only an example, and the connection terminal 153 is not limited thereto.

At least one of the connection terminals 153 may be disposed in a fan-out region. The fan-out region is defined as a region except for a region in which the electronic component is disposed. That is, the electronic component package 100A/100A' according to an example may be a fan-out package. The fan-out package may have reliability greater than that of a fan-in package, may implement a plurality of I/O terminals, and may easily perform 3D interconnection. In addition, since the fan-out package may be mounted on the electronic device without using a separate substrate as compared to a ball grid array (BGA) package, a land grid array (LGA) package, or the like, the fan-out package may be manufactured at a reduced thickness, and may have excellent price competitiveness.

The number, an interval, a disposition form, and the like, of connection terminals 153 are not particularly limited, and may be sufficiently modified depending on design particulars by those skilled in the art. For example, the number of connection terminals 153 may be several ten to several thousand depending on the number of electrode pads 161P of the electronic component 161. However, the number of connection terminals 145 is not limited thereto, and may also be several ten to several thousand or more or several ten to several thousand or less.

The electronic component package 100A according to an example may further include a support member 111 disposed on an opposite surface of the first insulating layer 121 to a surface of the first insulating layer 121 on which the electronic component 161 is disposed. That is, the support member 111 may not remain in the electronic component package 100A' as illustrated in FIG. 3B, or may remain in the electronic component package 100A as illustrated in FIG. 3A. The support member 111 may serve to support other components of the electronic component package 100A, and may maintain rigidity of the electronic component package 100A to effectively prevent generation of warpage.

An insulating material may be used as materials of the support member 111. Here, the insulating material may be a thermosetting resin such as an epoxy resin, a thermoplastic resin such as a polyimide resin, a resin having a reinforcement material such as a glass fiber or an inorganic filler impregnated in the thermosetting resin and the thermoplastic resin, such as pre-preg, ABF, FR-4, BT, or the like. In a case in which the resin in which the reinforcement material is impregnated is used as a material of the support member 111, the rigidity of the electronic component package 100A may be further improved.

Although not illustrated in detail in FIGS. 3A through 4, the electronic component package 100A/100A' according to an example may be applied to a system-in-package (SiP) module or a package-on-package (PoP) requiring three-dimensional connection. In this case, the electronic component package 100A/100A' according to an example may further include through-wirings penetrating through the second insulating layer 131; and other connection terminals connected to the through-wirings and externally exposed. Here, the through-wirings may be electrically connected to the second conductors 134 formed on the second insulating layer 131, and thus the through-wirings and the connection terminals may be electrically connected to the electronic component 161. A detailed description of other applications will be omitted.

Figure 5:
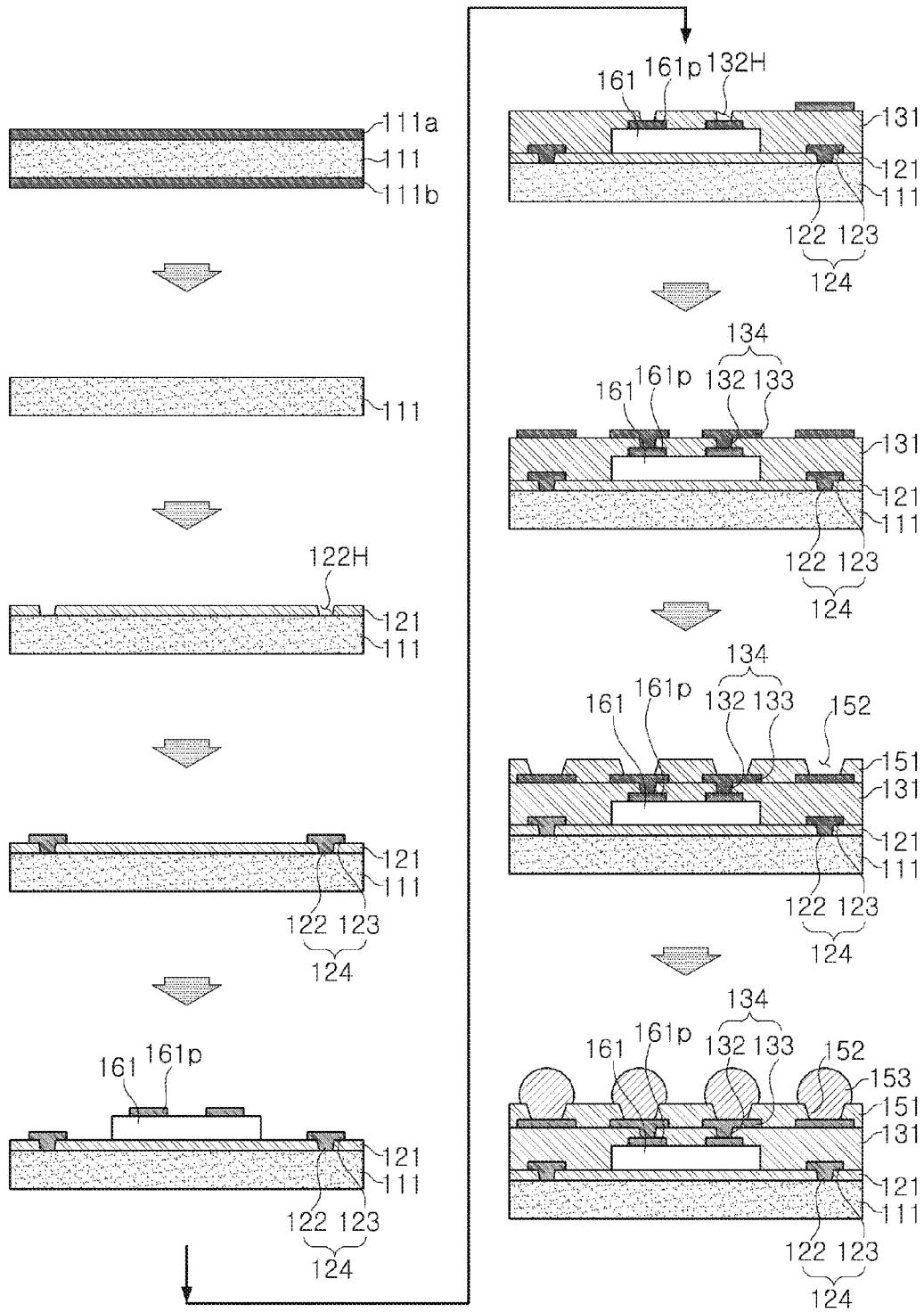
FIG. 5 is a schematic view illustrating examples of processes of manufacturing the electronic component package of FIGS. 3A and 3B.

FIG. 5 is a schematic view illustrating examples of processes of manufacturing the electronic component package of FIGS. 3A and 3B.

Referring to FIG. 5, a method of manufacturing the electronic component package 100A according to an example may include preparing the support member 111, forming the first insulating layer 121 on the support member 111, forming the first conductors 124 on the first insulating layer 121, disposing the electronic component 161 on the first insulating layer 121 so that the inactive side thereof is directed toward the first insulating layer 121, forming the second insulating layer 131 on the first insulating layer 121 to cover the electronic component 161, and forming the second conductors 134 on the second insulating layer 131. The first conductors 124 may be the fiducial marks for disposing the electronic component 161, and the second conductors 134 may be the redistribution pattern for redistributing the electronic component 161.

Hereinafter, respective processes will be described in more detail. However, a description for contents overlapping the contents described above will be omitted.

First, the support member 111 may be prepared. Any member may be used as the support member 111 as long as it contains the material as described above. For example, a general CCL may be used. In this case, copper foils 111a and 111b may be removed by a known etching process. The support member 111 may be manufactured and utilized at various sizes in order to facilitate mass production. That is, after the support member 111 having a large size is prepared, a plurality of electronic component packages 100A may be manufactured through a process to be described below. Then, the plurality of electronic component packages 100A may be singulated into individual packages through a sawing process, or the like. In a case in which a detach core is used as the support member 111, a double-sided process may be performed, and thus productivity may be further improved.

Next, the first insulating layer 121 may be formed on the support member 111. After the first insulating layer 121 is formed, first via holes 122H may be formed in the first insulating layer 121. The first insulating layer 121 may be formed by a known method, for example, a method of laminating a precursor of the first insulating layer 121 and then hardening the precursor, a method of applying a material for forming the first insulating layer 121 and then hardening the material, or the like, but is not limited thereto. As the method of laminating the precursor, for example, a method of performing a hot press process of pressing the precursor for a predetermined time at a high temperature, decompressing the precursor, and then cooling the precursor to a room temperature, cooling the precursor in a cold press process, and then separating a work tool, or the like, may be used. As the method of applying the material, for example, a screen printing method of applying ink with a squeegee, a spray printing method of applying ink in a mist form, or the like, may be used. The hardening process, which is a post-process, may be a process of drying the material so as not to be completely hardened in order to use a photolithography method, or the like. The first via hole 122H may be formed by a known method. For example, a photo via-hole may be formed by a photolithography method or a normal via hole may be formed using a mechanical drill, a laser drill, or the like.

Next, the first conductors 124 may be formed on the first insulating layer 121. The first conductor 124 may be formed by electrolytic copper plating, electroless copper plating, or the like, using a dry film pattern. In more detail, the first conductor 124 may be formed using a method such as chemical vapor deposition (CVD), physical vapor deposition (PVD), sputtering, a subtractive process, an additive process, a semi-additive process (SAP), a modified semi-additive process (MSAP), or the like, but is not limited thereto. The first vias 122 and the first patterns 123 may be simultaneously formed through plating, or the like, and at least some of the first vias 122 and the first patterns 123 may be integrated with each other.

Next, the electronic component 161 may be disposed on the first insulating layer 121. Here, the first conductors 124 may be used as the fiducial marks for disposing the electronic component 161. Therefore, the electronic component 161 may be precisely disposed. The electronic component 161 may be disposed so that an opposite layer thereof to a layer thereof on which the electronic pads 161P are disposed, that is, the inactive side is directed toward the first insulating layer 121. A method of disposing the electronic component 161 is not limited, and may be a known method.

Next, the second insulating layer 131 covering the electronic component 161 may be formed on the first insulating layer 121. After the second insulating layer 131 is formed, second via holes 132H may be formed in the second insulating layer 131. The second insulating layer 131 may be formed by a known method, for example, a method of laminating a precursor of the second insulating layer 131 and then hardening the precursor, a method of applying a material for forming the second insulating layer 131 and then hardening the material, or the like, but is not limited thereto. As the method of laminating the precursor, for example, a method of performing a hot press process of pressing the precursor for a predetermined time at a high temperature, decompressing the precursor, and then cooling the precursor to a room temperature, cooling the precursor in a cold press process, and then separating a work tool, or the like, may be used. As the method of applying the material, for example, a screen printing method of applying ink with a squeegee, a spray printing method of applying ink in a mist form, or the like, may be used. The hardening process, which is a post-process, may be a process of drying the material so as not to be completely hardened in order to use a photolithography method, or the like. The second via hole 132H may be formed by a known method. For example, a photo via-hole may be formed by a photolithography method or a normal via hole may be formed using a mechanical drill, a laser drill, or the like.

Next, the second conductors 134 may be formed on the second insulating layer 131. The second conductor 134 may be formed by electrolytic copper plating, electroless copper plating, or the like, using a dry film pattern. In more detail, the second conductor 134 may be formed using a method such as CVD, PVD, sputtering, a subtractive process, an additive process, an SAP, an MSAP, or the like, but is not limited thereto. The second vias 132 and the second patterns 133 may be simultaneously formed through plating, or the like, and at least some of the second vias 132 and the second patterns 133 may be integrated with each other.

Meanwhile, the third insulating layer 151 may be formed on the second insulating layer 131, if necessary. After the third insulating layer 151 is formed, the opening parts 152 may be formed in the third insulating layer 151 to expose at least some of the second patterns 133. The third insulating layer 151 may also be formed by a method of laminating a precursor of the third insulating layer 151 and then hardening the precursor, a method of applying a material for forming the third insulating layer 151 and then hardening the material, or the like. The opening parts 152 may be formed using a photolithography method, a mechanical drill, a laser drill, or the like.

In addition, the connection terminals 153 may be formed in the opening parts 152 of the third insulating layer 151, if necessary. A method of forming the connection terminals 153 is not particularly limited. That is, the connection terminals 153 may be formed by the method well-known in the related art depending on a structure or a form of the connection terminals 153. The connection terminals 153 may be fixed by reflow, and portions of the connection terminals 153 may be embedded in the third insulating layer 151 in order to enhance fixing force, and the remaining portions of the connection terminals 153 may be exposed to the outside, whereby reliability may be improved.

Although not illustrated, the method of manufacturing the electronic component package 100A' according to an example may further include removing the support member 111. That is, in a case in which the support member 111 is not required, the support member 111 may be removed by the known method.

Figure 6A:
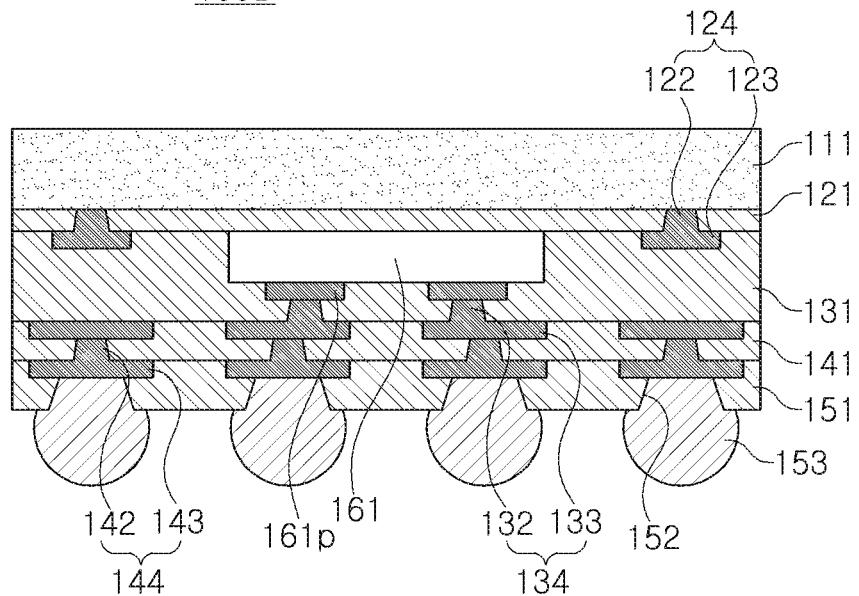
FIGS. 6A and 6B are cross-sectional views schematically illustrating another example of an electronic component package.
Figure 6B:
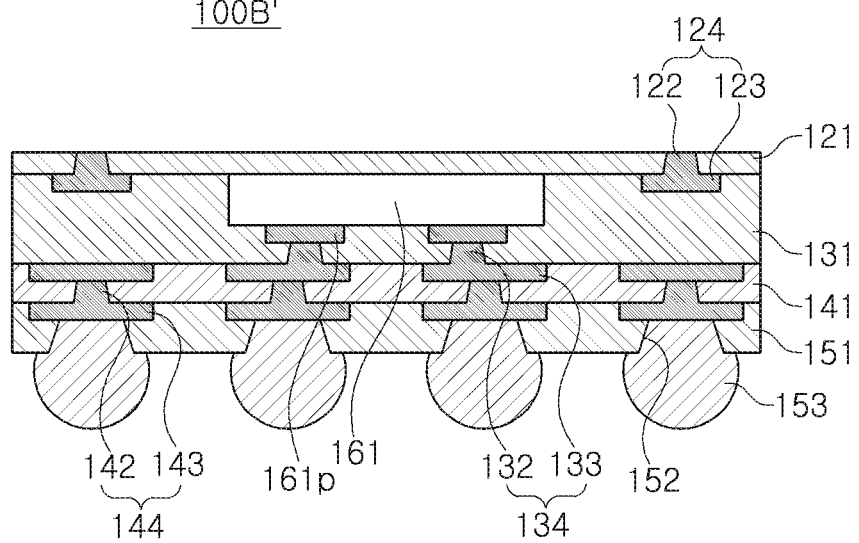

FIGS. 6A and 6B are cross-sectional views schematically illustrating another example of an electronic component package.

Referring to FIGS. 6A and 6B, in an electronic component package 100B/100B' according to another example, second insulating layers 131 and 141 may be formed of a plurality of layers, and the second insulating layers 131 and 141 may include second conductors 134 and 144, respectively. The second conductors 134 and 144 may include second vias 132 and 142 and second patterns 133 and 143, respectively. Also in this case, the support member 111 may remain in the electronic component package 100B as illustrated in FIG. 6A, or may not remain in the electronic component package 100B' as illustrated in FIG. 6B. Also in this case, the second conductors 134 and 144 of the second insulating layers 131 and 141 may serve as redistribution wirings of the electronic component 161, and more specifically, the electrode pads 161P of the electronic component 161. Since a detailed content thereof is the same as the content described above, a description thereof will be omitted. In some cases, the second insulating layers 131 and 141 and the second conductors 134 and 144 may be formed of a plurality of layers greater than two. Since a method of manufacturing the electronic component package 100B/100B' according to another example is the same as the method of manufacturing the electronic component package 100A/100A' according to an example except that the second insulating layers 131 and 141 and the second conductors 134 and 144 are formed of the plurality of layers, a detailed description thereof will be omitted.

Figure 7A:
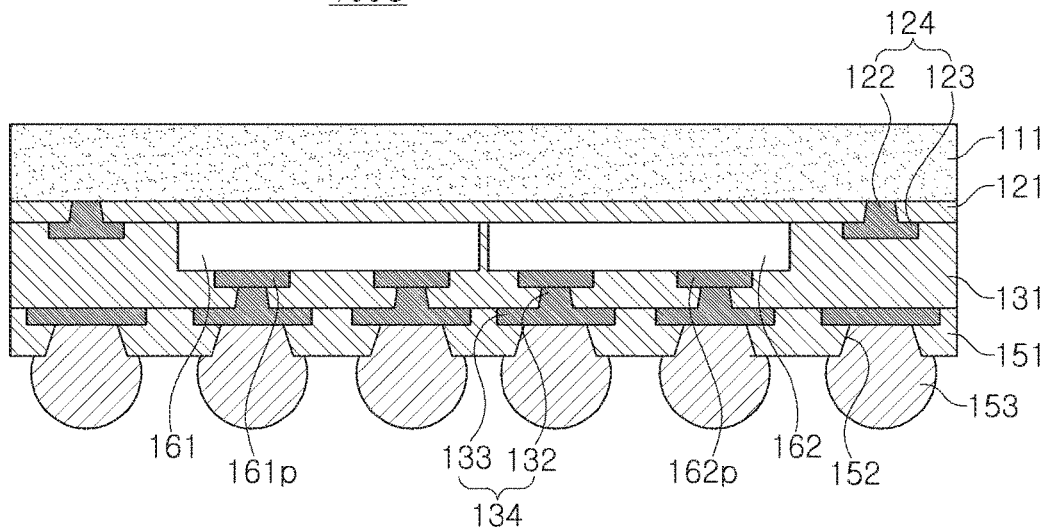
FIGS. 7A and 7B are cross-sectional views schematically illustrating another example of an electronic component package.
Figure 7B:
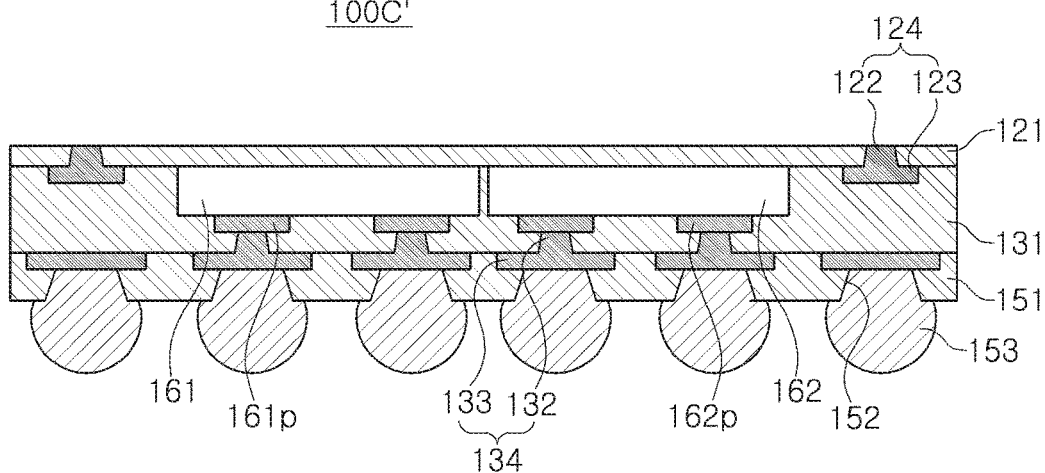

FIGS. 7A and 7B are cross-sectional views schematically illustrating another example of an electronic component package.

Referring to FIGS. 7A and 7B, in an electronic component package 100C/100C' according to another example, a plurality of electronic components 161 and 162 may be disposed. The plurality of electronic components 161 and 162 may have electrode pads 161P and 162P, respectively, and may be redistributed by second conductors 134 formed on a second insulating layer 131. First conductors 124 formed on a first insulating layer 121 may also be disposed between the plurality of electronic components 161 and 162, if necessary. Also in this case, the support member 111 may remain in the electronic component package 100C as illustrated in FIG. 7A, or may not remain in the electronic component package 100C' as illustrated in FIG. 7B. Since the other detailed contents are the same as the contents described above, a description thereof will be omitted. Since a method of manufacturing the electronic component package 100C/100C' according to another example is the same as the method of manufacturing the electronic component package 100A/100' according to an example except that the plurality of electronic components 161 and 162 are disposed, a detailed description thereof will be omitted.

As set forth above, according to an exemplary embodiment in the present disclosure, a new electronic component package in which a cavity process may be omitted, a process cost may be reduced, and an electronic component may be precisely disposed, and a method of manufacturing the same may be provided.

In the present disclosure, a word "connected" is a concept including a case in which any component is indirectly connected to another component by an adhesive, or the like, as well as a case in which any component is directly connected to another component. In addition, a word "electrically connected" is a concept including both of a case in which any component is physically connected to another component and a case in which any component is not physically connected to another component. In addition, in the present disclosure, terms "first", "second", and the like, are used to distinguish one component from another component, and do not limit a sequence, importance, and the like, of the corresponding components. In some cases, a first component may be named a second component and a second component may also be similarly named a first component, without departing from the scope of the present disclosure.

A term "example" used in the present disclosure does not mean the same exemplary embodiment, but is provided in order to emphasize and describe different unique features. However, the above suggested examples may also be implemented to be combined with a feature of another example. For example, even though particulars described in a specific example are not described in another example, it may be understood as a description related to another example unless described otherwise. In addition, terms used in the present disclosure are used only in order to describe an example rather than limiting the present disclosure. Here, singular forms include plural forms unless interpreted otherwise in a context.

While exemplary embodiments have been shown and described above, it will be apparent to those skilled in the art that modifications and variations could be made without departing from the scope of the present invention as defined by the appended claims.

What is claimed is:

1. An electronic component package comprising:
a first via formed in a first insulating layer and a first pattern formed on the first via;
an electronic component disposed on the first insulating layer so that an inactive side thereof is directed toward the first insulating layer; and
a second insulating layer disposed on the first insulating layer so as to cover the electronic component and having a redistribution pattern formed thereon so as to be electrically connected to the electronic component,
wherein the first via and the first pattern are electrically insulated from the electronic component,
the first via and the first pattern are first fiducial marks for disposing the electronic component,
the electronic component package further comprises second fiducial marks including a second via formed in the first insulating layer and a second pattern formed on the second via, and
the second fiducial marks are electrically insulated from the first fiducial marks and from the electronic component.

2. The electronic component package of claim 1, wherein in a thickness of the electronic component package, a size of the first via formed in the first insulating layer and a size of a via of the redistribution pattern both increase or both decrease.

3. The electronic component package of claim 1, wherein a level of the first via formed in the first insulating layer is higher than a level of the electronic component with reference to the redistribution pattern.

4. The electronic component package of claim 1, wherein the first and second insulating layers contain a photo imagable dielectric material.

5. The electronic component package of claim 1, wherein the electronic component includes at least one integrated circuit.

6. The electronic component package of claim 1, further comprising:
a third insulating layer disposed on the second insulating layer and having opening parts formed therein; and
connection terminals disposed in the opening parts of the third insulating layer,
wherein at least one of the connection terminals is disposed in a fan-out region.

7. The electronic component package of claim 6, wherein the third insulating layer is a solder resist layer, and
the connection terminal is a solder ball.

8. The electronic component package of claim 1, further comprising a support member disposed on an opposite surface of the first insulating layer to a surface of the first insulating layer on which the electronic component is disposed.

9. The electronic component package of claim 8, wherein the support member contains an insulating resin and a reinforcement material.

10. The electronic component package of claim 1, wherein the first pattern is disposed on a surface of the first insulating layer, and the inactive side of the electronic component is in contact with the surface of the first insulating layer.

11. An electronic component package comprising:
a first via formed in a first insulating layer and a first conductive pattern formed on the first via;
an electronic component disposed on the first insulating layer so that an inactive side thereof is directed toward the first insulating layer; and
a second insulating layer disposed on the first insulating layer so as to cover the electronic component, and having a second via and a second conductive pattern thereon so as to be electrically connected to the electronic component,
wherein a size of the first via and a size of the second via both increase in a stacking direction of the electronic component and the first insulating layer,
the first via and the first pattern are first fiducial marks for disposing the electronic component and are electrically insulated from the electronic component,
the electronic component package further comprises second fiducial marks including a third via formed in the first insulating layer and a third pattern formed on the third via, and
the second fiducial marks are electrically insulated from the first fiducial marks and from the electronic component.

12. The electronic component package of claim 11, wherein a level of the first via is higher than a level of the electronic component with reference to the second insulating layer.

13. An electronic component package comprising:
a first via formed in a first insulating layer and a first conductive pattern formed on the first via;
an electronic component disposed on the first insulating layer so that an inactive side thereof is directed toward the first insulating layer; and
a second insulating layer disposed on the first insulating layer so as to cover the electronic component, and having a second via and a second conductive pattern thereon so as to be electrically connected to the electronic component,
wherein the entire first via is disposed at a level above the entire electronic component with reference to the second conductive pattern and electrically insulated from the electronic component.

14. The electronic component package of claim 13, wherein in a thickness of the electronic component package, a size of the first via and a size of the second via both increase or both decrease.

* * * * *